US012598750B2

(12) United States Patent
    Kim

(10) Patent No.:     US 12,598,750 B2
(45) Date of Patent:        Apr. 7, 2026

(54) MANUFACTURING METHOD OF SEMICONDUCTOR DEVICE

(71) Applicant: SK hynix Inc., Icheon-si (KR)

(72) Inventor: Jong Wook Kim, Icheon-si (KR)

(73) Assignee: SK hynix Inc., Icheon-si (KR)

( * ) Notice:    Subject to any disclaimer, the term of this patent is extended or adjusted under 35 U.S.C. 154(b) by 572 days.

(21) Appl. No.: 18/100,248

(22) Filed:      Jan. 23, 2023

(65)              Prior Publication Data

US 2024/0040784 A1      Feb. 1, 2024

(30)         Foreign Application Priority Data

Aug. 1, 2022    (KR) .......................... 10-2022-0095348

(51) Int. Cl.

| | |
|---|---|
| *H01L 29/76* | (2006.01) |
| *H01L 21/56* | (2006.01) |
| *H01L 23/00* | (2006.01) |
| *H01L 29/94* | (2006.01) |
| *H10B 43/27* | (2023.01) |
| *H01L 23/498* | (2006.01) |
| *H10B 80/00* | (2023.01) |

(52) U.S. Cl.
    CPC ............. *H10B 43/27* (2023.02); *H01L 21/56* (2013.01); *H01L 24/48* (2013.01); *H01L 23/49816* (2013.01); *H01L 2224/48225* (2013.01); *H10B 80/00* (2023.02)

(58) Field of Classification Search
    CPC ......... H10B 43/27; H10B 80/00; H01L 21/56; H01L 24/48; H01L 23/49816; H01L 2224/48225; H01L 25/0657; H01L 2225/0651; H01L 2225/06562; G11C 16/0483; G11C 16/10; G11C 16/30; G11C 16/3459
    USPC .......................................................... 257/295
    See application file for complete search history.

(56)              References Cited

U.S. PATENT DOCUMENTS

| | | | |
|---|---|---|---|
| 2008/0157326 A1* | 7/2008 | Han ...................... | H01L 25/105 |
| | | | 438/109 |
| 2020/0020404 A1* | 1/2020 | Kim ......................... | G11C 7/14 |

FOREIGN PATENT DOCUMENTS

| | | |
|---|---|---|
| KR | 1020090014531 A | 2/2009 |
| KR | 101030617 B1 | 4/2011 |
| KR | 101974198 B1 | 4/2019 |
| KR | 1020200055595 A | 5/2020 |
| KR | 1020210022797 A | 3/2021 |
| KR | 1020220099063 A | 7/2022 |

OTHER PUBLICATIONS

"Resistance to soldering heat condition for Package", https://www.ablic.com/en/semicon/support/package/solder-temp-profile/.

* cited by examiner

*Primary Examiner* — Theresa T Doan
(74) *Attorney, Agent, or Firm* — WILLIAM PARK AND ASSOCIATES LTD.

(57)              ABSTRACT

In a method of manufacturing a semiconductor device, the method includes: manufacturing a memory chip including memory cells and a dummy cell; and programming the dummy cell before a packaging process of the memory chip is performed, wherein the programming of the dummy cell is performed after the memory chip is completely manufactured.

26 Claims, 17 Drawing Sheets

FIG. 11

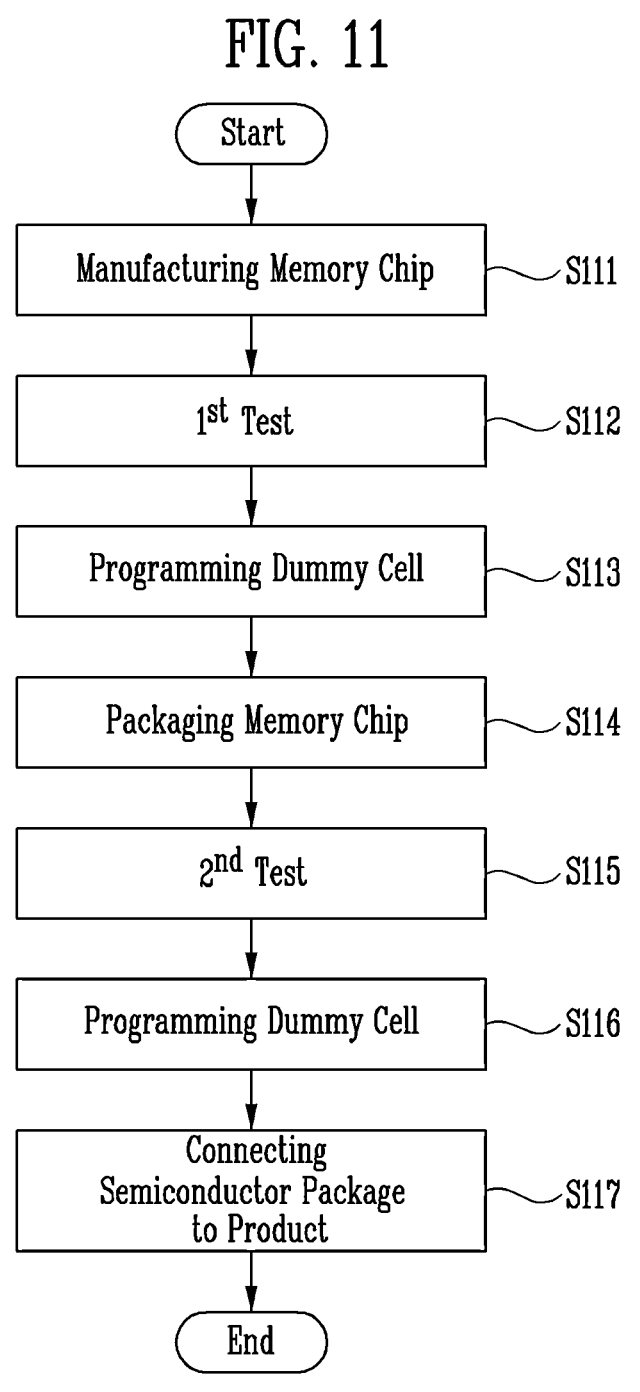

Start

Manufacturing Memory Chip —— S111

1$^{st}$ Test —— S112

Programming Dummy Cell —— S113

Packaging Memory Chip —— S114

2$^{nd}$ Test —— S115

Programming Dummy Cell —— S116

Connecting
Semiconductor Package
to Product —— S117

End

Processing with High Temperature

MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2022-0095348, filed on Aug. 1, 2022, in the Korean Intellectual Property Office, the entire disclosure of which is incorporated herein by reference.

BACKGROUND

1. Technical Field

The present disclosure generally relates to a manufacturing method of a semiconductor device, and more particularly, to a manufacturing method of a semiconductor device including memory chips.

2. Related Art

A semiconductor package may include a plurality of memory chips. The memory chips may be configured to store data, or output or erase stored data. The memory chips may be classified into a volatile memory or a nonvolatile memory according to a method or structure in which data is stored. For example, the volatile memory may include a dynamic random access memory (DRAM), a synchronous DRAM (SDRAM), a double data rate SDRAM (DDR-SDRAM), a low power DDR-SDRAM (LPDDR-SDRAM), and the like. The nonvolatile memory may include a NAND flash memory, a NOR flash memory, a resistive random access memory (ReRAM), a phase-change random access memory (PRAM), a magneto-resistive random access memory (MRAM), a ferroelectric random access memory (FRAM), a spin transfer torque random access memory (SST-RAM), and the like.

A plurality of memory chips may be manufactured using a single wafer, and cut memory chips may be manufactured as a semiconductor device through a packaging process.

In some processes of manufacturing a semiconductor device, the semiconductor device may be exposed to a high temperature. The high temperature may be a temperature higher than a room temperature. When the semiconductor device exposed to the high temperature, movement of various kinds of impurities dispersed in memory chips included in the semiconductor device may be activated, and therefore, the reliability of the semiconductor device may be deteriorated.

SUMMARY

In accordance with an embodiment of the present disclosure, there is provided a method of manufacturing a semiconductor device, the method may include: manufacturing a memory chip including memory cells and a dummy cell; and programming the dummy cell before a packaging process of the memory chip is performed.

In accordance with another embodiment of the present disclosure, there is provided a method of manufacturing a semiconductor device, the method may include: manufacturing a memory chip including memory cells and a dummy cell; trapping electrons in the dummy cell by performing a program operation; and moving mobile ions distributed in the memory chip to a region adjacent to the dummy cell by performing a high temperature process, when the electrons are trapped in the dummy cell.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 11 is a view illustrating a manufacturing method of a semiconductor device in accordance with a second embodiment of the present disclosure.

FIGS. 12A, 12B, 12C, and 12D are views illustrating a movement order of mobile ions in a semiconductor device manufactured in accordance with an embodiment of the present disclosure.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as limited to the embodiments set forth herein.

Hereinafter, it will be understood that, although the terms "first," "second," etc. may be used herein to describe various elements, these elements should not be limited by these terms. These terms are only used to distinguish one element from another element. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. As used herein, the term "and/or" includes any and all combinations of one or more of the associated listed items. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

Embodiments provide a manufacturing method of a semiconductor device, in which mobile ions distributed in a memory chip gather in a specific region during a manufacturing process of the semiconductor device, so that the reliability of the semiconductor device can be improved.

Figure 1:
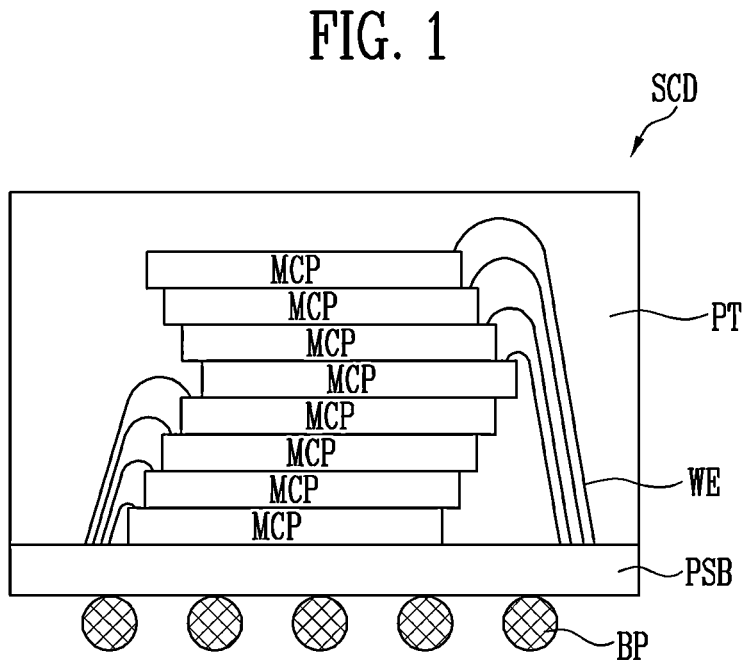
FIG. 1 is a view illustrating a semiconductor device.

FIG. 1 is a view illustrating a semiconductor device.

Referring to FIG. 1, the semiconductor device SCD may include a package substrate PSB, memory chips MCP, wires WE, a protection layer PT, and bumps BP.

The memory chips MCP correspond to a memory device configured to store, output, or erase data. The memory chips MCP may be classified into a volatile memory or a nonvolatile memory according to a method or structure in which data is stored. For example, the volatile memory may include a dynamic random access memory (DRAM), a synchronous DRAM (SDRAM), a double data rate SDRAM (DDR-SDRAM), a low power DDR-SDRAM (LPDDR-SDRAM), and the like. The nonvolatile memory may include a NAND flash memory, a NOR flash memory, a resistive random access memory (ReRAM), a phase-change random access memory (PRAM), a magneto-resistive random access memory (MRAM), a ferroelectric random access memory (FRAM), a spin transfer torque random access memory (SST-RAM), and the like.

The same kind of memory chips MCP may be included in the semiconductor device SCD, but the number, performance, reliability, and durability of the memory chips MCP included in the semiconductor device SCD may vary according to the semiconductor device SCD. For example, when comparing an enterprise Solid State Drive (eSSD) and a consumer Solid State Drive (cSSD), in which the semiconductor device SCD is mounted, with each other, the eSSD requires a semiconductor device SCD having high performance, reliability, durability, capacity, and the like as compared with a semiconductor device SCD required in the cSSD. The eSSD may be a memory product for servers, and the cSSD may be a memory product used for computers or notebook computers. Therefore, the semiconductor device SCD to be mounted in the eSSD may be configured with memory chips MCP having high performance, reliability, and durability as compared with the semiconductor device SCD to be mounted in the cSSD. Also, the semiconductor device SCD to be mounted in the eSSD may be configured with a large number of memory chips MCP as compared with the semiconductor device SCD to be mounted in the cSSD.

The wires WE correspond to a structure which electrically connects the memory chips MCP and the package substrate PSB to each other, and may be formed of a conductive material. The protection layer PT is a structure for protecting the memory chips MCP and the wires WE, and may be formed of an encapsulant. For example, the protection layer PT may be formed of epoxy resin as thermosetting resin. Therefore, in a process of forming the protection layer PT, a high temperature process for curing the liquid encapsulant may be performed. For example, the high temperature process may be performed at a temperature of 50° C. or higher. When the protection layer PT is cured through the high temperature process, the memory chips MCP, the wires WE, and the package substrate PSB are integrated, so that the semiconductor device SCD can be manufactured.

Figure 2:
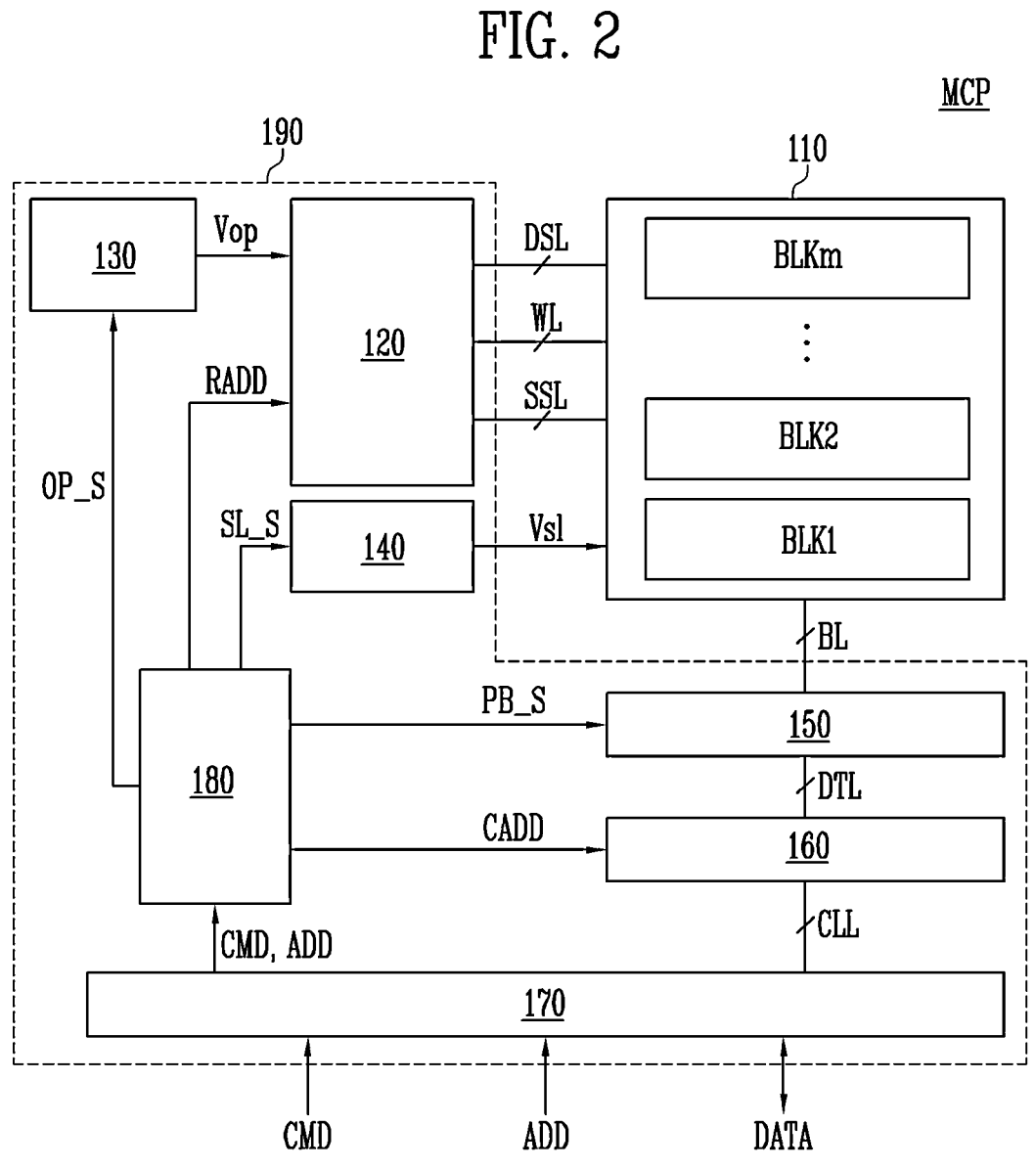
FIG. 2 is a view illustrating a memory chip.

FIG. 2 is a view illustrating a memory chip.

Referring to FIG. 2, the memory chip MCP may be configured as a volatile memory or a nonvolatile memory. The memory chip MCP configured as the nonvolatile memory will be described as an example.

The memory chip MCP may include a memory cell array 110 and a peripheral circuit 190.

The memory cell array 110 may include a plurality of memory cells in which data is stored. In an embodiment, the memory cell array 110 may include first to mth memory blocks BLK1 to BLKm configured in a two-dimensional or three-dimensional structure. In the memory blocks BLK1 to BLKm configured in the two-dimensional structure, memory cells may be arranged in a direction parallel to a substrate. In the memory blocks BLK1 to BLKm configured in the three-dimensional structure, memory cells may be stacked in a vertical direction from a substrate. In the following embodiment, the memory blocks BLK1 to BLKm configured in the three-dimensional structure is described as an example.

Each of the memory blocks BLK1 to BLKm may include memory cells and dummy cells. The memory cells may be used to store normal data. The normal data may be data associated with an operation of the memory chip MCP or data stored by a user. The dummy cells may be used to trap mobile ions which may have influence on the reliability of the memory chip MCP while a manufacturing process of the semiconductor device is performed. After the manufacturing process of the semiconductor device is completed, the dummy cells may be used for various uses such as a use for storing dummy data.

The peripheral circuit 190 may be configured to perform a program operation for storing data in the memory cell array 110, a read operation for outputting data stored in the memory cell array 110, and an erase operation for erasing data stored in the memory cell array 110. The peripheral circuit 190 may include a row decoder 120, a voltage generator 130, a source line driver 140, a page buffer group 150, a column decoder 160, an input/output circuit 170, and a control circuit 180.

The row decoder 120 may be connected to the memory cell array 110 through drain select lines DSL, word lines WL, and source select lines SSL. The row decoder 120 may transfer operating voltages Vop to a plurality of drain select lines DSL, a plurality of word lines WL, and a plurality of source select lines SSL in response to a row address RADD.

The voltage generator 130 may generate various operating voltages Vop used for a program operation, a read operation, or an erase operation in response to an operation signal OP_S.

The source line driver 140 may generate a source voltage Vsl in response to a source line control signal SL_S, and transmit the source voltage Vsl to a source line connected to the memory cell array 110 or float the source line. The source voltage Vsl may be 0V, be a positive voltage higher than 0V, or be a negative voltage lower than 0V.

The page buffer group 150 may include a plurality of page buffers connected to the memory cell array 110 through bit lines BL. The page buffers may temporarily store data DATA received through a plurality of bit lines BL in response to a page buffer control signal PB_S. The page buffers may sense voltages or currents of the plurality of bit lines BL in a read operation.

The column decoder 160 may transmit data DATA input from the input/output circuit 170 to the page buffer group 150 or transmit data DATA stored in the page buffer group 150 to the input/output circuit 170, in response to a column address CADD. The column decoder 160 may exchange data DATA with the input/output circuit 170 through column lines CLL. The column decoder 160 may exchange data DATA with the page buffer group 150 through data lines DTL.

The input/output circuit 170 may transfer, to the control circuit 180, a command CMD and an address ADD, which are transferred from an external device (e.g., a controller) of the memory chip MCP. The input/output circuit 170 may receive data DATA transferred from the external device in a program operation, and output data read from selected memory cells to the external device in a read operation.

The control circuit 180 may be configured to output the operation signal OP_S, the row address RADD, the source line control signal SL_S, the page buffer control signal PB_S, and the column address CADD in response to the command CMD and the address ADD. The control circuit 180 may include software configured to perform a program, read or erase operation in response to the command CMD, and hardware configured to output the operation signal OP_S, the row address RADD, the source line control signal SL_S, the page buffer control signal PB_S, and the column address CADD in response to the software and the address ADD.

Figure 3:
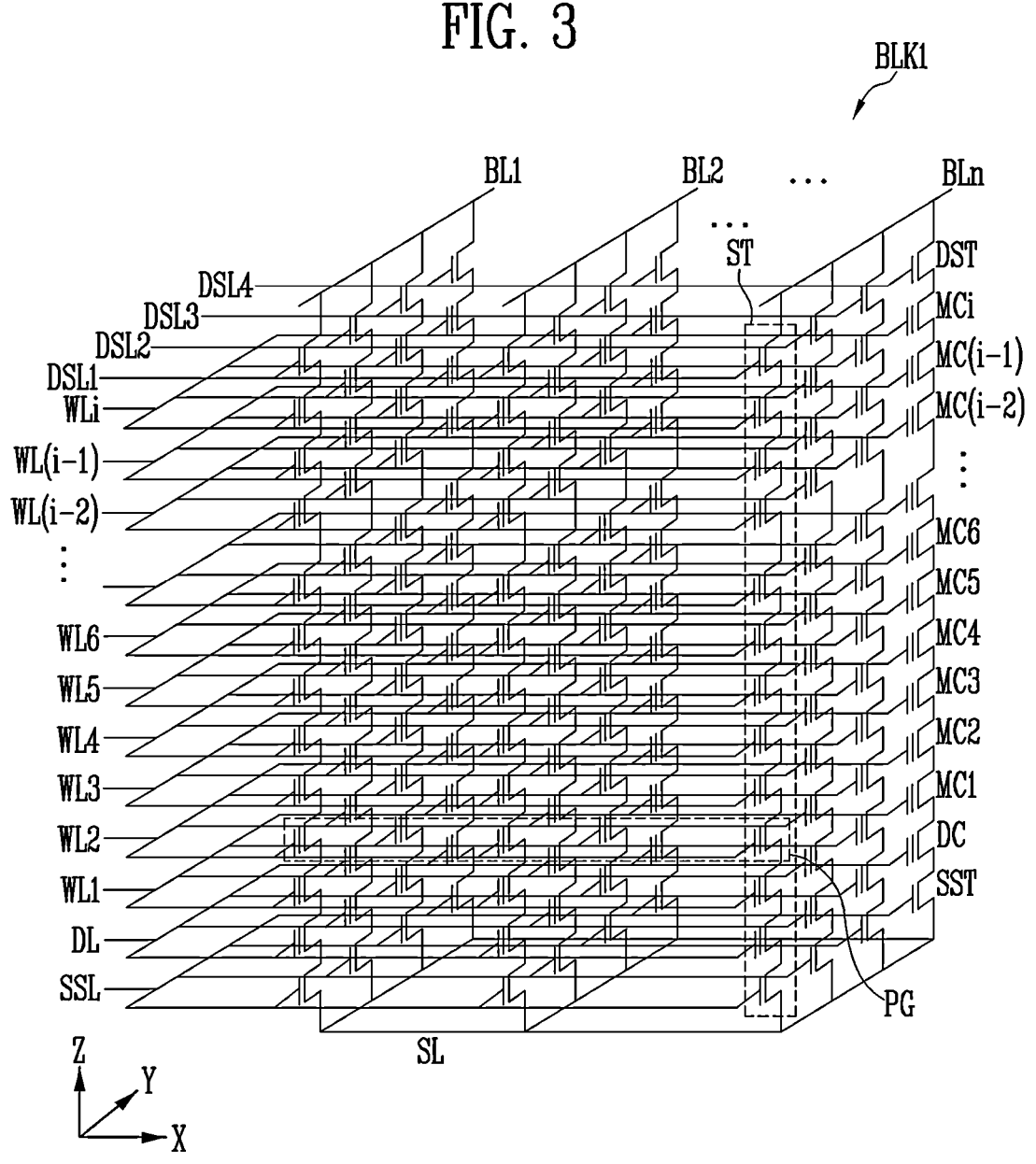
FIG. 3 is a view illustrating a memory block.

FIG. 3 is a view illustrating a memory block.

Referring to FIGS. 3 and 2, the memory blocks BLK1 to BLKm may be configured similarly to one another, and therefore, any one memory block BLK1 among the memory blocks BLK1 to BLKm is illustrated in FIG. 3.

Referring to FIG. 3, the memory block BLK1 includes strings ST connected between first to nth bit lines BL1 to BLn and a source line SL. The first to nth bit lines BL1 to BLn extend along the Y direction, and are arranged to be spaced apart from each other along the X direction. Therefore, the strings ST may also be arranged to be spaced apart from each other along the X and Y directions. For example, strings ST may be arranged between the first bit line BL1 and the source line SL, and strings ST may be arranged between the second bit line BL2 and the source line SL. In this manner, strings ST may be arranged between the nth bit line BLn and the source line SL. The strings ST may extend along a Z direction.

Any one string ST among the strings ST connected to the nth bit line BLn will be described as an example. The string ST may include a source select transistor SST, first to ith memory cells MC (i.e., MC1 to MCi), a drain select transistor DST, and at least one dummy cell DC. FIG. 3 is a view schematically illustrating a structure of the memory block BLK, and therefore, the number of the source select transistor SST, the first to ith memory cells MC1 to MCi, the drain select transistor DST, and the at least one dummy cell DC, which are included in the strings ST, may be changed according to a memory chip.

Gates of source select transistors SST included in different strings ST may be connected to a source select line SSL, gates of first to ith memory cells MC1 to MCi included in different strings ST may be connected to first to ith word lines WL1 to WLi, gates of drain select transistors DST included in different strings ST may be connected to drain select lines DSL1 to DSL4, and gates of dummy cells DC included in different strings ST may be connected to a dummy line DL.

Memory cells formed in the same layer among the first to ith memory cells MC1 to MCi may be connected to the same word line. For example, first memory cells MC1 included in different strings ST may be commonly connected to the first word line WL1, and ith memory cells MCi included in different strings ST may be commonly connected to the ith word line WLi. A group of memory cells which are included in different strings ST and are connected to the same word line becomes a page PG. A program operation or a read operation may be performed in units of pages PG.

Because dummy cells DC connected to the same dummy line DL also constitute a page PG, the dummy cells may be programmed or read in units of pages.

Figure 4:
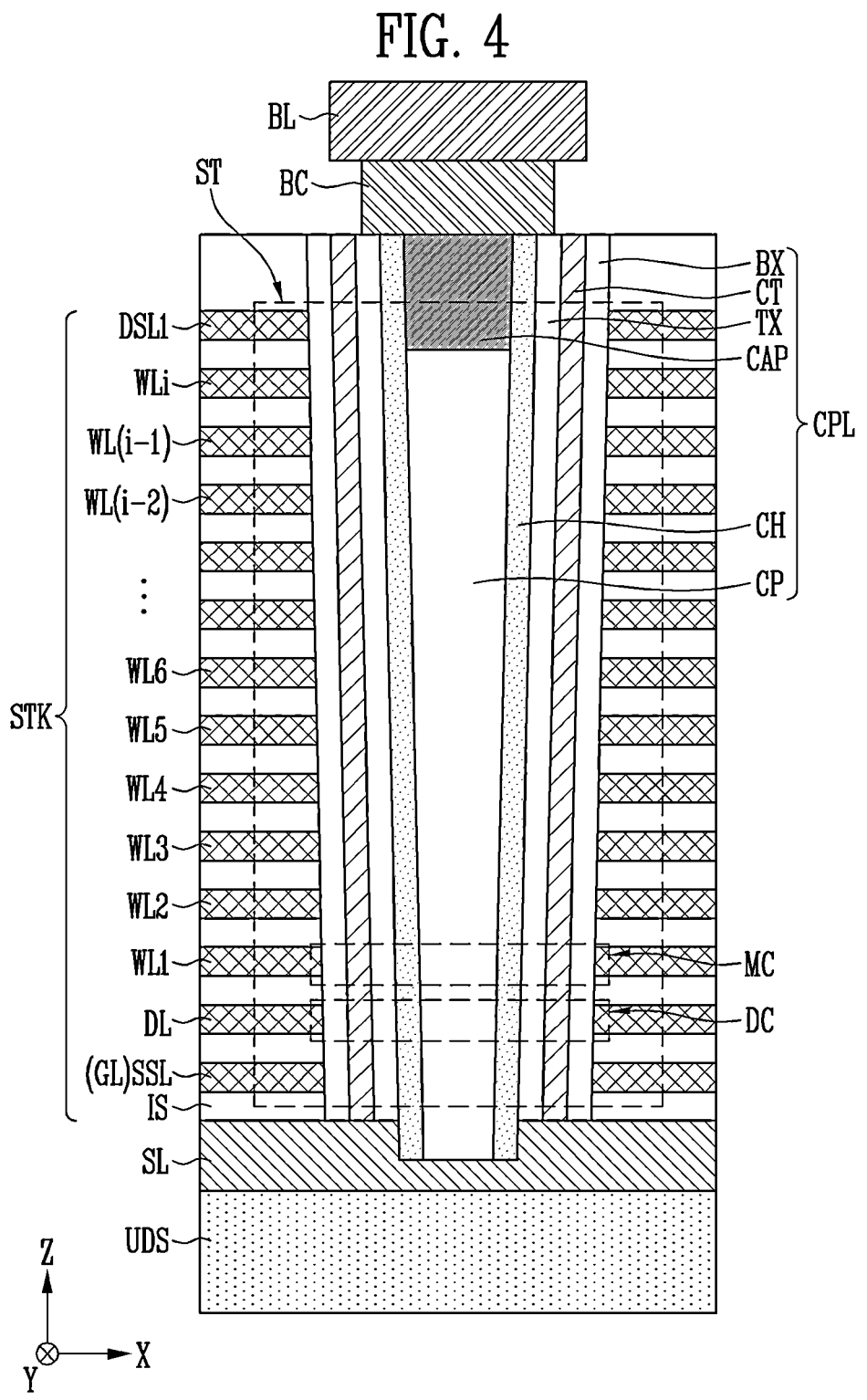
FIG. 4 is a view illustrating a structure of a string.

FIG. 4 is a view illustrating a structure of a string.

Referring to FIG. 4, a source line SL may be formed on a lower structure UDS, and a stack structure STK may be formed on the source line SL. The lower structure UDS may be a substrate or a peripheral circuit. The source line SL may be formed of a conductive material. For example, the source line SL may be formed of poly-silicon. The stack structure STK may include gate lines GL and insulating layers IS formed between the gate lines GL. The gate lines GL may include a source select line SSL, a dummy line DL, first to ith word lines WL1 to WLi, and a first drain select line DSL1. The gate lines GL may be formed of a conductive material. For example, the gate lines GL may be formed of a conductive material such as tungsten (W), molybdenum (Mo), cobalt (Co) or nickel (Ni), or a semiconductor material such as silicon (Si) or poly-silicon (poly-Si). In addition, the gate lines GL may be formed of various metal materials. The insulating layer IS may be formed of an oxide layer or a silicon oxide layer. The source select line SSL, the dummy line DL, the first to ith word lines WL1 to WLi, and the drain select line DSL may be formed above the source line SL.

The string ST may be configured with a cell plug CPL penetrating the stack structure STK. The cell plug CPL may include a blocking layer BX, a charge trap layer CT, a tunnel insulating layer TX, a channel layer CH, a core pillar CP, and a capping layer CAP. For example, the blocking layer BX may be formed in a cylindrical shape penetrating the stack structure STK, and be formed of an oxide layer or a silicon oxide layer. The charge trap layer CT may be formed in a cylindrical shape along an inner wall of the blocking layer BX, and be formed of a nitride layer. The tunnel insulating layer TX may be formed in a cylindrical shape along an inner wall of the charge trap layer CT, and be formed of an oxide layer or a silicon oxide layer. The channel layer CH may be formed in a cylindrical shape along an inner wall of the tunnel insulating layer TX, and be formed of poly-silicon. The core pillar CP may be formed in a cylindrical pillar shape filling the inside of the channel layer CH, and be formed of an insulating material such as an oxide layer or a silicon oxide layer. The capping layer CAP may be formed on the top of the core pillar CP, and be formed of a conductive material. For example, when the capping layer CAP is formed on the top of the core pillar CP, a height of a top surface of the core pillar CP may be formed lower than a height of a top surface of the channel layer CH, and the capping layer CAP may be formed in an upper region of the core pillar CP surrounded by the channel layer CH.

A bit line contact BC and a bit line BL may be formed on the top of the cell plug CPL. The bit line contact BC may be formed of a conductive material, and be in contact with the channel layer CH included in the cell plug CPL. The bit line BL may be formed on the top of the bit line contact BC, and be formed of a conductive material.

Figure 5:
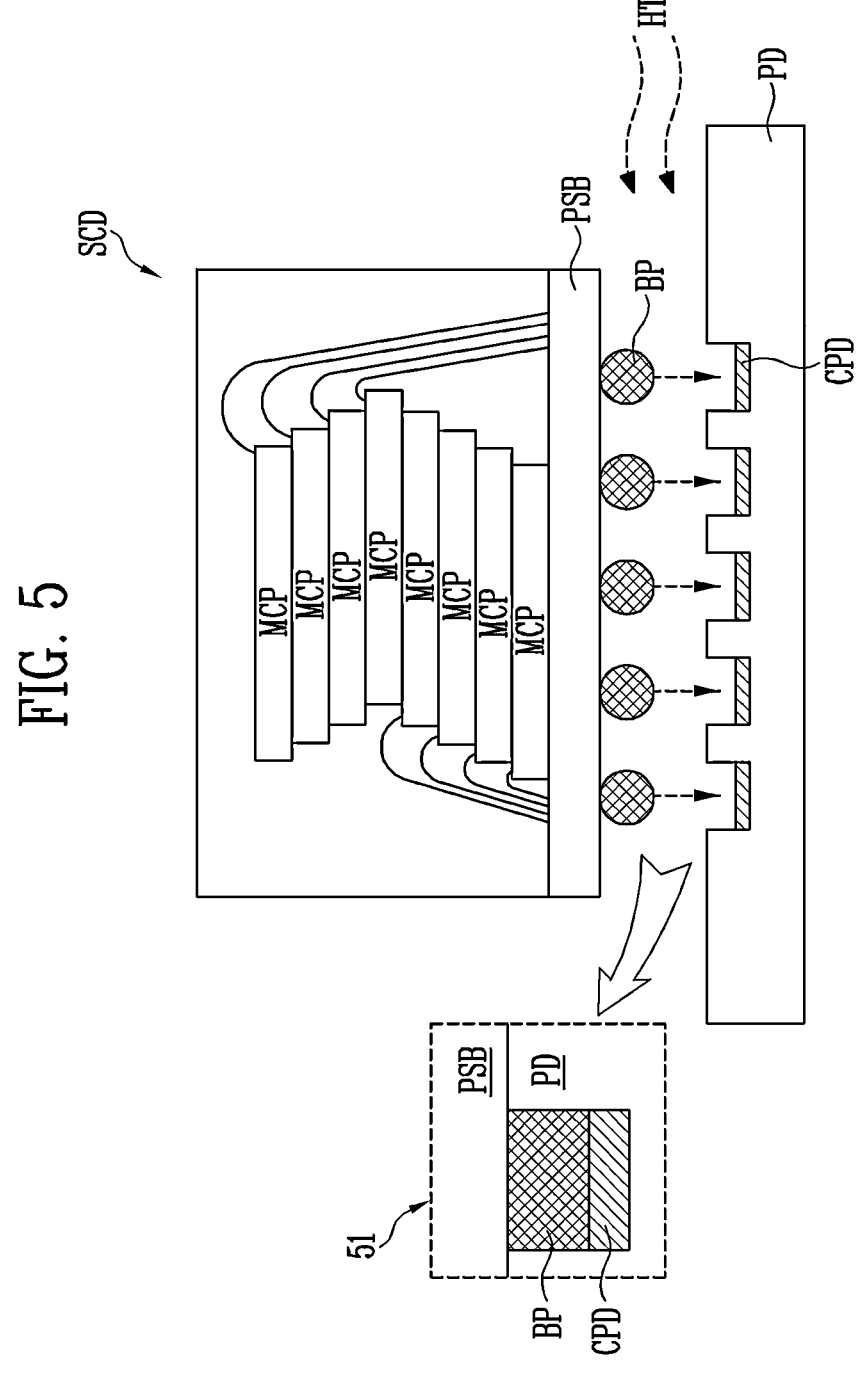
FIG. 5 is a view illustrating a bonding process of the semiconductor device and a product.

FIG. 5 is a view illustrating a bonding process of the semiconductor device and a product.

Referring to FIG. 5, when a semiconductor device SCD is completely manufactured, a bonding process of fastening the semiconductor device SCD to a product PD may be performed. The semiconductor device SCD shown in FIG. 5 is identical to the semiconductor device SCD shown in FIG. 1, and therefore, descriptions of the structure of the semiconductor device SCD will be omitted.

The product PD may be a memory system including a plurality of semiconductor devices SCD. For example, the product PD may an enterprise Solid State Drive (eSSD), a consumer Solid State Drive (cSSD), an embedded Multi-Chip Package (eMCP), or an embedded MultiMedia Card (eMMC). In addition, the product PD may include various memory systems. The eSSD is a product for servers, and is a memory system which requires high performance, reliability, and durability. The cSSD is a memory system mainly used for computers or notebook computers, and may require performance lower than the performance of the eSSD. The eMCP is a memory system in which a DRAM and a NAND flash are packaged as one, and may be mainly used for notebook computers, smart phones, tablet PCs, or the like. The eMMC is a memory system coupled to a controller having a multimedia card interface, and may be mainly used for notebook computers, smart phones, tablet PCs, or the like.

The semiconductor device SCD and the product PD may be fastened to each other through a bonding process of bonding bumps BP formed at a lower end of the semiconductor device SCD to bonding pads CPD formed at an upper end of the product PD. When the bumps BP protrude at the bottom of the semiconductor device SCD, each of regions bonded to the bumps BP at the upper end of the product PD is configured in a recessed structure, and the bonding pads CPD may be formed at lower portions of the recessed structures. The bumps BP and the bonding pads CPD may be formed of a conductive material.

The bonding process may be performed in a high temperature HT environment to reflow the bumps BP. Referring to an enlarged view 51 of a partial region in which the bump BP and the bonding pad CPD are bonded to each other, the bump BP may be reflowed into the recessed structure by high temperature HT. The high temperature HT may be set to different temperatures according to the kind of the bumps BP. For example, the high temperature HT may be set as a temperature of 50° C. or higher. Because the bonding process is performed in the high temperature HT environment, the bonding process may be referred to as a high temperature process.

Because the high temperature process is performed in the high temperature HT environment in which the bumps BP can be reflowed, some of mobile ions distributed in memory chips MCP may be moved due to the high temperature HT. The mobile ions will be described in detail as follows.

Figure 6A:
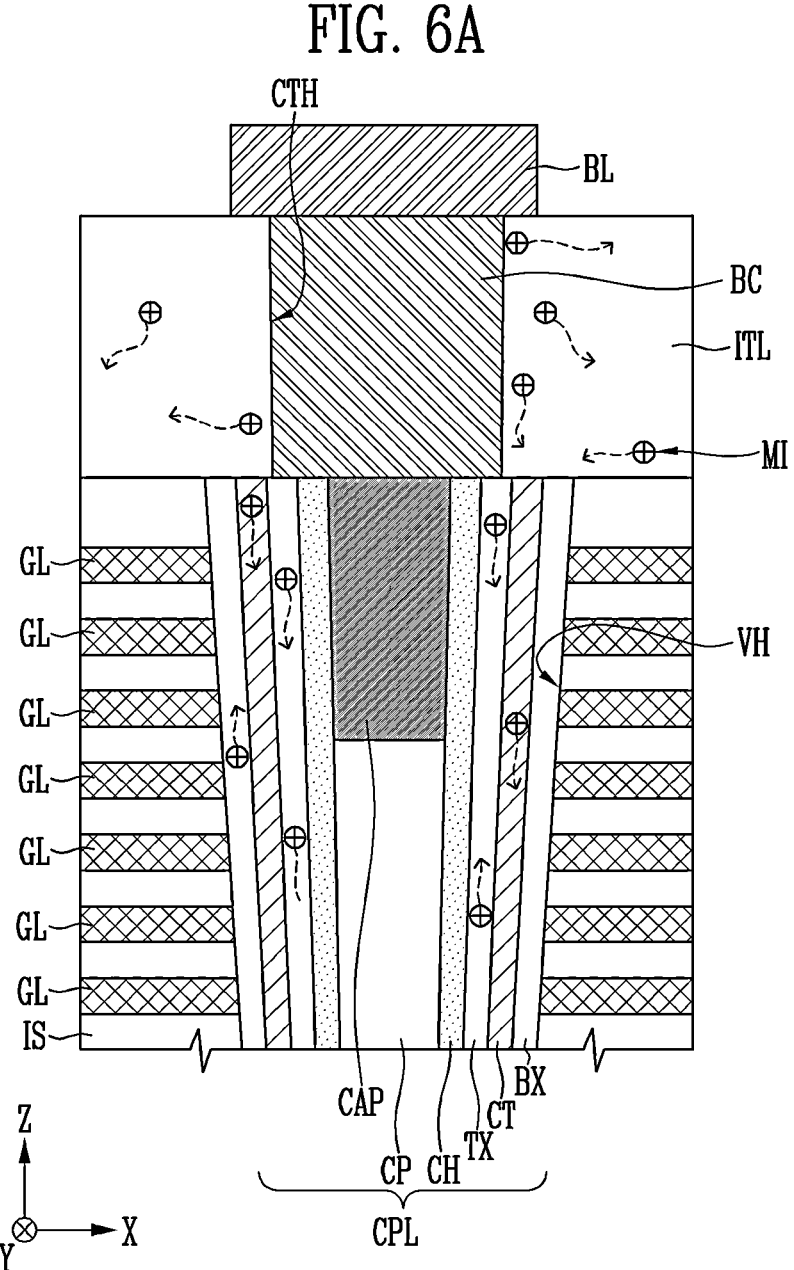
FIGS. 6A and 6B are views illustrating mobile ions distributed in a memory chip.
Figure 6B:
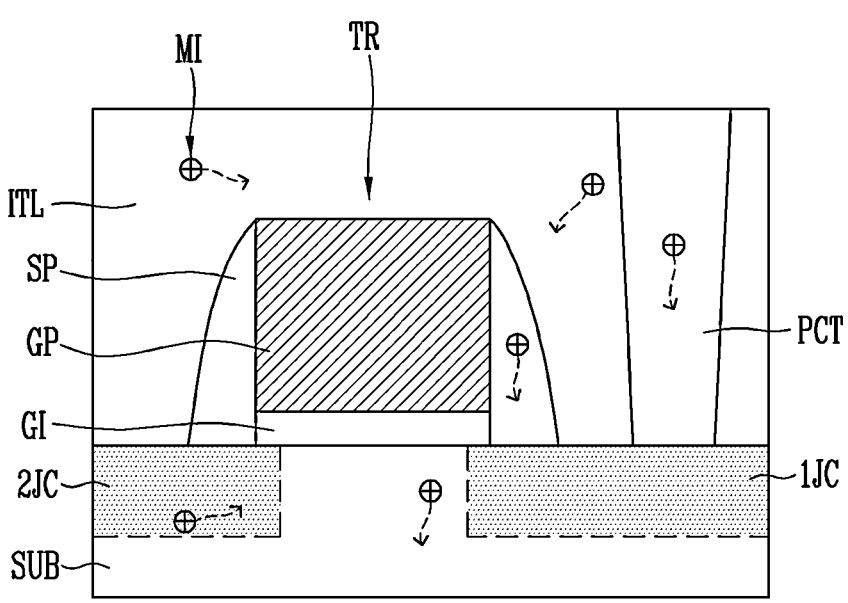

FIGS. 6A and 6B are views illustrating mobile ions distributed in a memory chip.

Referring to FIG. 6A, a partial structure of a memory block among structures constituting a memory chip is illustrated. The memory block may include a plurality of gate lines GL, insulating layers IS, a cell plug CPL, and an interlayer insulating layer ITL, and the cell plug CPL may be electrically connected to a bit line BL through a bit line contact BC. The cell plug CPL may include a blocking layer BX, a charge trap layer CT, a tunnel insulating layer TX, a channel layer CH, a core pillar CP, and a capping layer CAP. As described above, the memory block is configured with various materials formed in various structures, and hence unnecessary ions may be introduced into a partial region of the memory block during a manufacturing process of the memory chip. Ions moved by reacting with high temperature among the ions are referred to as mobile ions MI.

The mobile ions MI may be mainly generated by plasma used in a process of forming a conductive material. For example, the mobile ions MI may be mainly generated in a process of forming the gate lines GL, a process of forming the cell plug CPL inside a vertical hole VH, a process of forming the bit line contact BC inside a contact hole CTH, or the like. For example, the mobile ions MI may include a sodium ion (Na+), an iron ion (Fe+), or a zinc ion (Zn+). In addition, the mobile ions MI may include various ions. The mobile ions MI may be moved while kinetic energy is increased at high temperature. The mobile ions MI may be mainly moved through an insulating material. When the mobile ions MI are uniformly distributed inside the memory chip, a retention characteristic of memory cells included in the memory chip may be deteriorated.

Referring to FIG. 6B, a partial structure of a peripheral circuit among the structures constituting the memory chip is illustrated. The peripheral circuit may be configured with a plurality of transistors and lines. A region in which any one transistor TR is formed will be described as an example.

The transistor TR may include a gate insulating layer GI and a gate pattern GP, which are formed on the top of a substrate SUB. A spacer SP for protecting the gate insulating layer GI and the gate pattern GP may be formed on sidewalls of the gate insulating layer GI and the gate pattern GP. First and second junction regions 1JC and 2JC may be formed in the substrate SUB in contact with both ends of the gate insulating layer GI. A peripheral contact PCT for transferring a voltage may be formed on the top of the first junction region 1JC. An interlayer insulating layer ITL may be formed on the top of the transistor TR and the peripheral contact. As shown in FIG. 6B, the peripheral circuit is also configured with various materials formed in various structures, and hence mobile ions MI generated during a manufacturing process of the memory chip may be distributed in many regions.

Because the mobile ions MI are mainly conductive ions, the mobile ions MI may have more electrical influence in the memory block than the peripheral circuit. For example, because transistors TR performs an operation of transferring or blocking a voltage in the peripheral circuit, the mobile ions MI might not have great influence on transferring or blocking the voltage in the peripheral circuit. However, memory cells are included in the memory block, and therefore, a small electrical difference may have influence on the reliability of the memory chip.

Accordingly, in this embodiment, a method of processing the mobile ions which can have electrical influence in the memory block is provided. It is difficult to remove mobile ions activated in a process after the memory chip is completely manufactured. Therefore, in this embodiment, a gathering step of gathering mobile ions into a region which has no influence on the reliability of the memory chip may be performed.

In order to perform the gathering step, in this embodiment, dummy cells and dummy lines are included in the memory block. Various structures of the memory block including the dummy cells and the dummy lines will be described as follows.

Figure 7A:
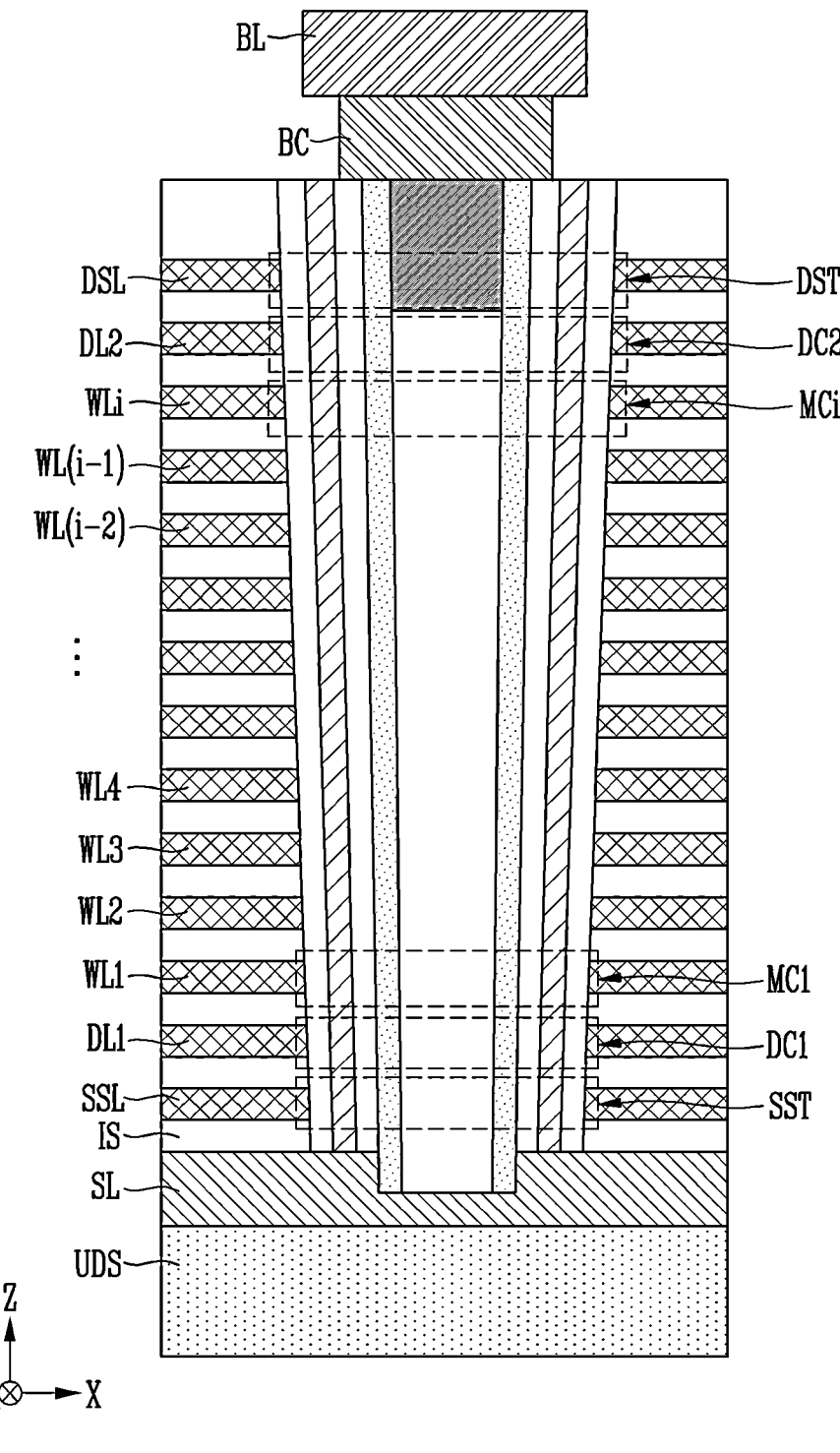
FIGS. 7A, 7B, and 7C are views illustrating a structure of a memory block in accordance with an embodiment of the present disclosure.
Figure 7B:
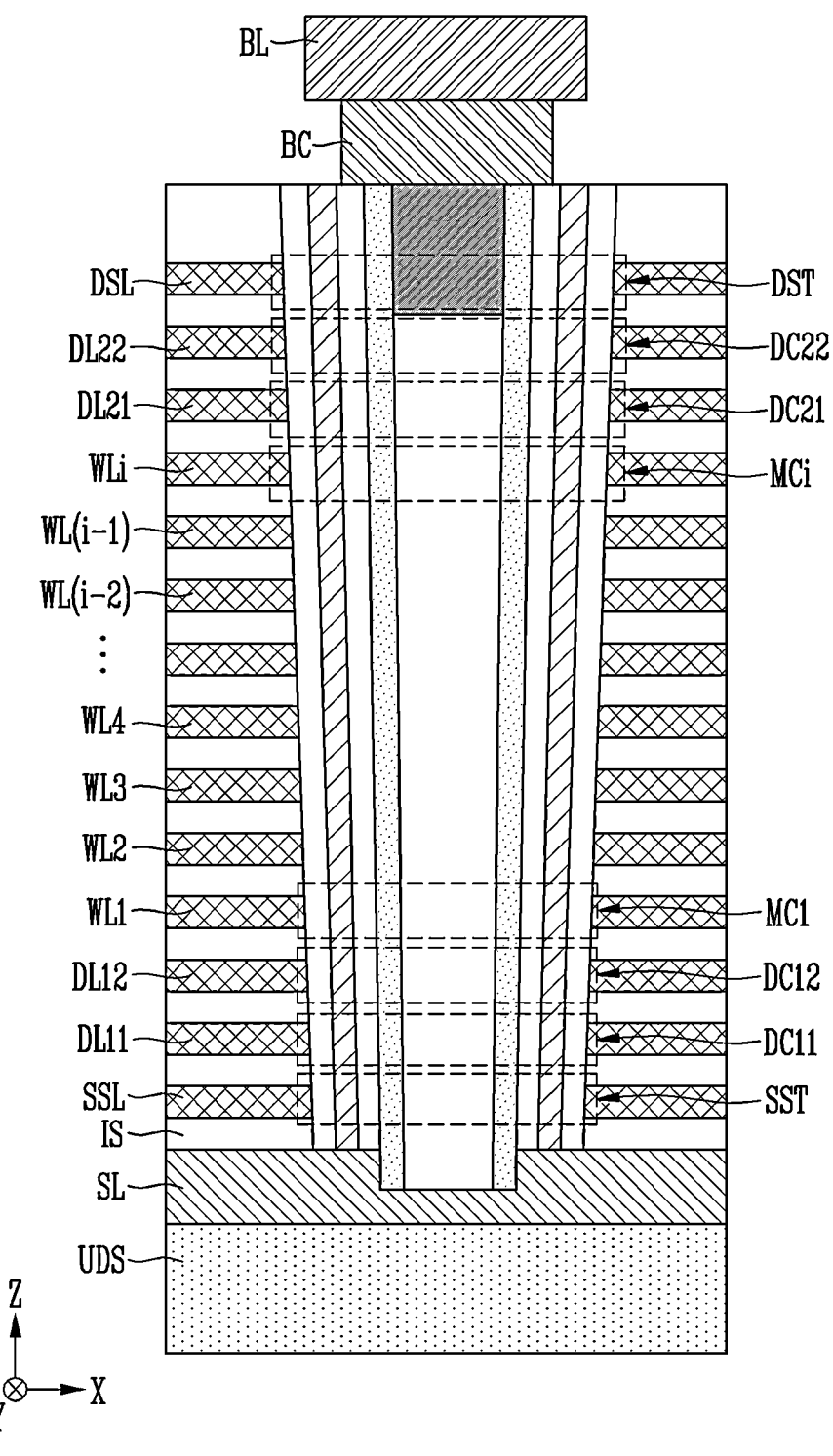
Figure 7C:
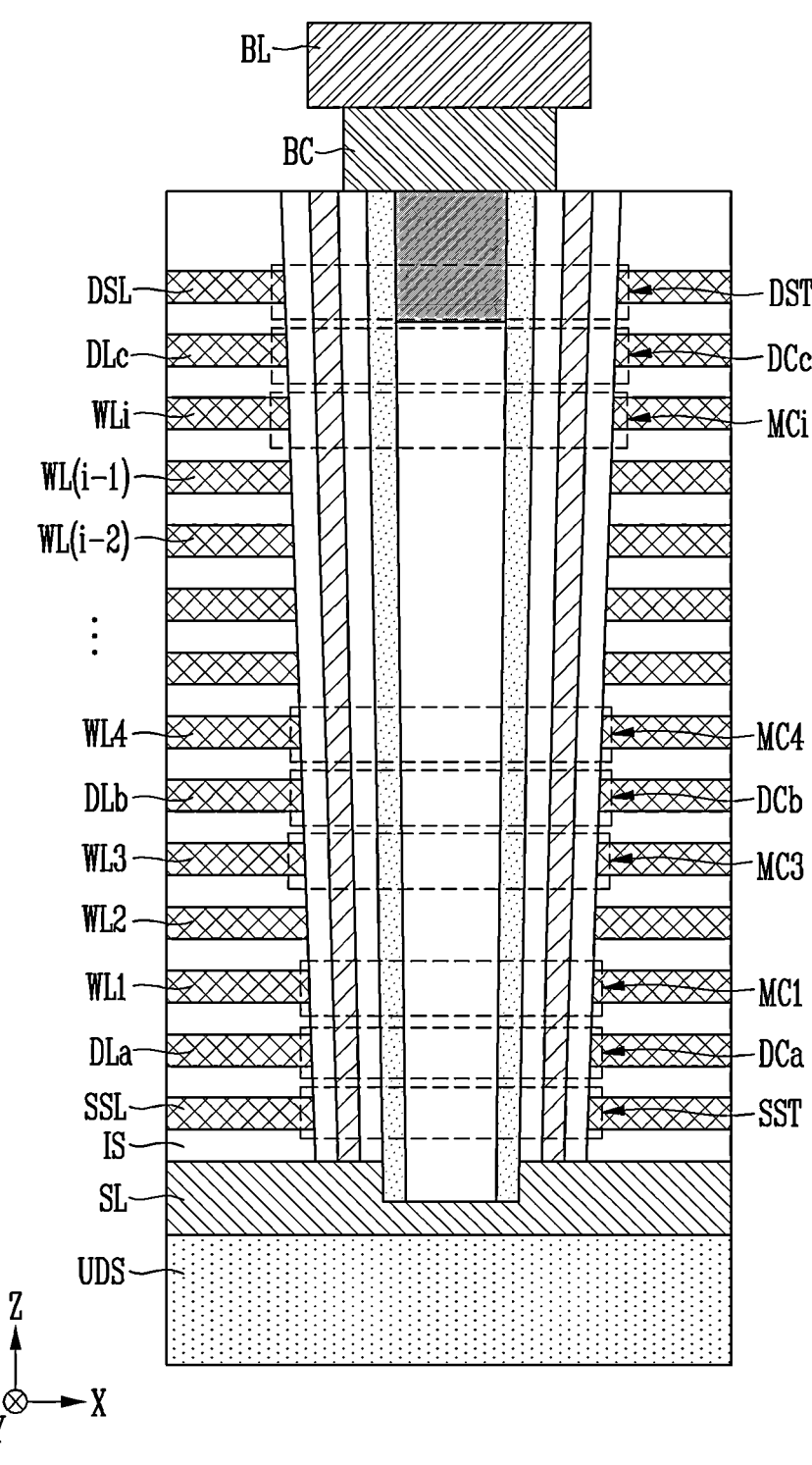

FIGS. 7A to 7C are views illustrating a structure of a memory block in accordance with an embodiment of the present disclosure.

Referring to FIG. 7A, a dummy cell may be formed in a region adjacent to a source select transistor SST and a drain select transistor DST. A first dummy cell DC1 may be disposed between the source select transistor SST and a first memory cell MC1, and a second dummy cell DC2 may be disposed between the drain select transistor DST and an ith memory cell MCi. A gate of the first dummy cell DC1 may be connected to a first dummy line DL1, and a gate of the second dummy cell DC2 may be connected to a second dummy line DL2.

Referring to FIG. 7B, a plurality of dummy cells DC11, DC12, DC21, and DC22 may be formed in a region adjacent to the source select transistor SST and the drain select transistor DST. For example, eleventh and twelfth dummy cells DC11 and DC12 may be disposed between the source select transistor SST and the first memory cell MC1, and twenty-first and twenty-second dummy cells DC21 and DC22 may be disposed between the drain select transistor DST and the ith memory cell MCi. A gate of the eleventh dummy cell DC11 may be connected to an eleventh dummy line DL11, a gate of the twelfth dummy cell DC12 may be connected to a twelfth dummy line DL12, a gate of the twenty-first dummy cell DC21 may be connected to a twenty-first dummy line DL21, and a gate of the twenty-second dummy cell DC22 may be connected to a twenty-second dummy line DL22. Although a structure in which two dummy cells are disposed in a region adjacent to each of the source select transistor SST and the drain select transistor DST is illustrated in FIG. 7B, the number of dummy cells disposed in each region may be changed. For example, a number of dummy cells adjacent to the source select transistor SST may be greater than a number of dummy cells adjacent to the drain select transistor DST. For example, a number of dummy cells adjacent to the source select transistor SST may be smaller than a number of dummy cells adjacent to the drain select transistor DST.

Referring to FIG. 7C, dummy cells may be formed between the source select transistor SST and the drain select transistor DST. For example, the dummy cells may be formed between first to ith memory cells MC1 to MCi between the source select transistor SST and the drain select transistor DST. For example, an ath dummy cell DCa may be disposed between the source select transistor SST and the first memory cell MC1, a bth dummy cell DCb may be disposed between the third and fourth memory cells MC3 and MC4, and a cth dummy cell DCc may be disposed between the ith memory cell MCi and the drain select transistor DST.

In addition to the structures shown in FIGS. 7A to 7C, various numbers of dummy cells and dummy lines may be formed in various regions.

Figure 8:
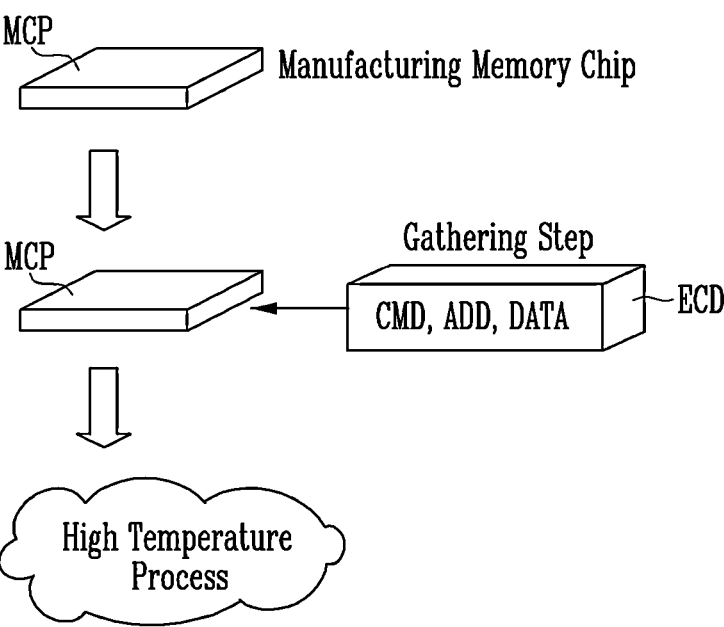
FIG. 8 is a view illustrating a manufacturing method of a semiconductor memory device in accordance with a first embodiment of the present disclosure.
Figure 9A:
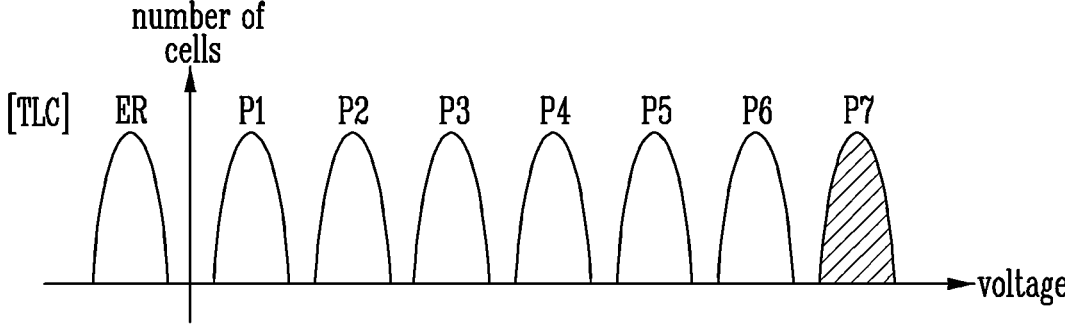
FIGS. 9A and 9B are views illustrating a threshold voltage distribution of dummy cells.
Figure 9B:
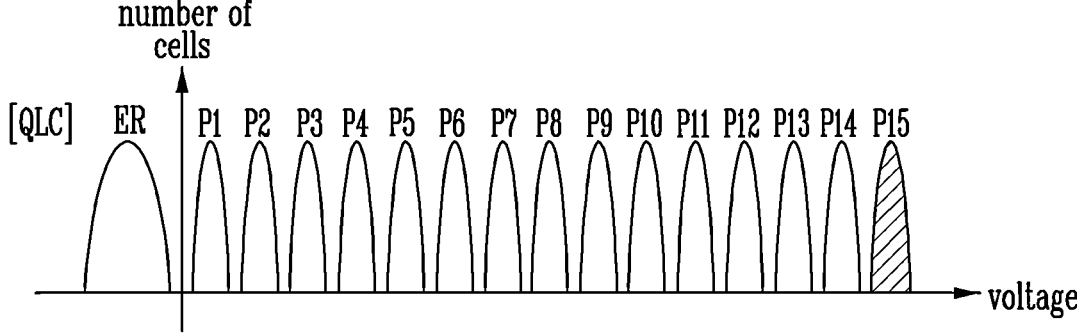
Figure 10:
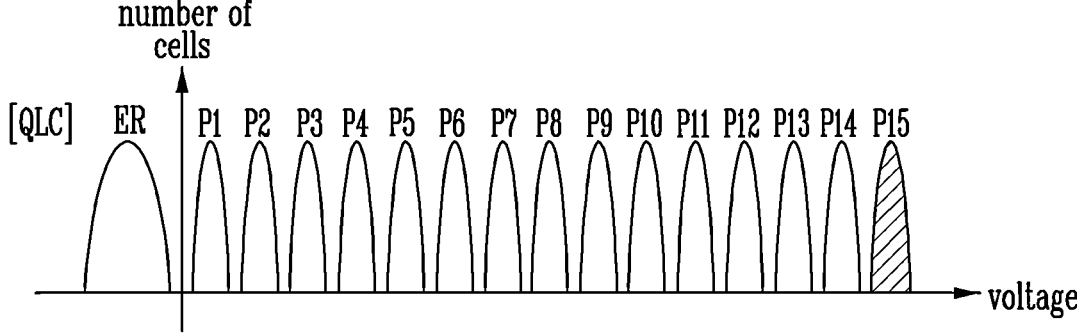
FIG. 10 is a view illustrating movement of mobile ions after a dummy program operation in accordance with an embodiment of the present disclosure.

FIG. 8 is a view illustrating a manufacturing method of a semiconductor memory device in accordance with a first embodiment of the present disclosure. FIGS. 9A and 9B are views illustrating a threshold voltage distribution of dummy cells. FIG. 10 is a view illustrating movement of mobile ions after a dummy program operation in accordance with an embodiment of the present disclosure.

Referring to FIG. 8, when a memory chip MCP is completely manufactured, a gathering step may be performed before a high temperature process is performed. The gathering step is a step of trapping mobile ions distributed in the memory chip MCP in a specific region. The specific region may be set as a region which has no influence on an operation of memory cells. For example, the specific region may be a region in which dummy cells are formed. Various structures of a memory block including dummy cells are illustrated in FIGS. 7A to 7C, and therefore, descriptions of the structure of the memory cell including the dummy cells will be omitted.

In the gathering step, a program operation for increasing a threshold voltage of the dummy cells may be performed. The program operation is an operation of trapping electrons in the dummy cells. The other memory cells except the dummy cells are maintained in an erase state.

In order to program the dummy cells, an external control device ECD may be used. For example, the external control device ECD may be a test device or a debugging device, which can test the memory chip MCP. For example, an external control device such as TRACE32 may be used. The external control device ECD may transmit, to the memory chip MCP, a command CMD, an address ADD, and data DATA, which are used to program the dummy cells. The command CMD may be a program command. The address ADD may be an address of dummy lines connected to the dummy cells. The data DATA may be data corresponding to a highest threshold voltage among threshold voltages which the memory cells may have. In order to gather a larger number of mobile ions into the periphery of the dummy cells in the high temperature process performed after the gathering step, the dummy cells may be programmed to have the highest threshold voltage.

The program operation may be performed in a manner that applies a program voltage to the dummy line and apply a pass voltage to the other word lines. The program voltage is a voltage for increasing the threshold voltage of the dummy cells, and the pass voltage is a voltage for forming a channel in a string by turning on the memory cells. In the program operation, in an embodiment, a verify operation for determining a level of the threshold voltage of the dummy cells may be performed, but a verify operation for shortening an operation time may be omitted. For example, when the verify operation is performed, the program operation may be performed in an Incremental Step Pulse Program (ISPP) manner that stepwisely increases the program voltage. When the program operation is performed in the ISPP manner, a target level may be set as a level corresponding to the highest program state. When the verify operation is omitted, the program operation may be performed in a manner that applies the program voltage to the dummy line at least once. The number of times the program voltage is applied to the dummy line may be changed.

The threshold voltage of the dummy cells will be described with reference to FIGS. 9A and 9B.

Referring to FIGS. 8 and 9A, when a program operation using a Triple Level Cell (TLC) manner in which 3-bit data is stored in one memory cell is performed, memory cells may be programmed to become an erase state ER or any one state among first to seventh program states P1 to P7 according to a threshold voltage. A state having a lowest threshold voltage is the erase state ER. The first program state P1 among the program states is a state having a lowest threshold voltage, and the seventh program state P7 is a state having a highest threshold voltage. Therefore, when the program operation performed in the gathering step is performed in the TLC manner, dummy cells may be programmed to become the seventh program state P7.

Referring to FIGS. 8 to 9B, when a program operation using a Quadruple Level Cell (QLC) manner in which 4-bit data is stored in one memory cell is performed, memory cells may be programmed to become an erase state ER or any one state among first to fifteenth program states P1 to P15 according to a threshold voltage. The fifteenth program state P15 among the program states is a state having a highest threshold voltage. Therefore, when the program operation performed in the gathering step is performed in the QLC manner, dummy cells may be programmed to become the fifteenth program state P15.

Referring to FIGS. 8 to 10, in the gathering step, after dummy cells DC included in the memory chip MCP are programmed, a high temperature process may be performed. The high temperature process may be performed in a process of packaging the memory chip MCP. When the high temperature process is performed, mobile ions MI distributed in the memory chip MCP may be moved. Most of the mobile ions have a positive charge, and the programmed dummy cells DC has a negative charge due to electrons ET. Therefore, the mobile ions MI having the positive charge may gather at the periphery of the dummy cells DC having the negative charge due to gravitation between the positive charge and the negative charge.

In an embodiment, when the high temperature process is ended, and the temperature of the memory chip MCP is lowered to a room temperature, the ions moved to the periphery of the dummy cells may be fixed at the periphery of the dummy cells. Thus, in an embodiment, even after the memory chip MCP is completely manufactured, the mobile ions distributed inside the memory chip MCP can be trapped at the periphery of the dummy cells instead of the periphery of the memory cells. Accordingly, in an embodiment, the reliability of the memory cells can be improved.

FIG. 11 is a view illustrating a manufacturing method of a semiconductor device in accordance with a second embodiment of the present disclosure. FIGS. 12A to 12D are views illustrating a movement order of mobile ions in a semiconductor device manufactured in accordance with an embodiment of the present disclosure.

Figure 12A:
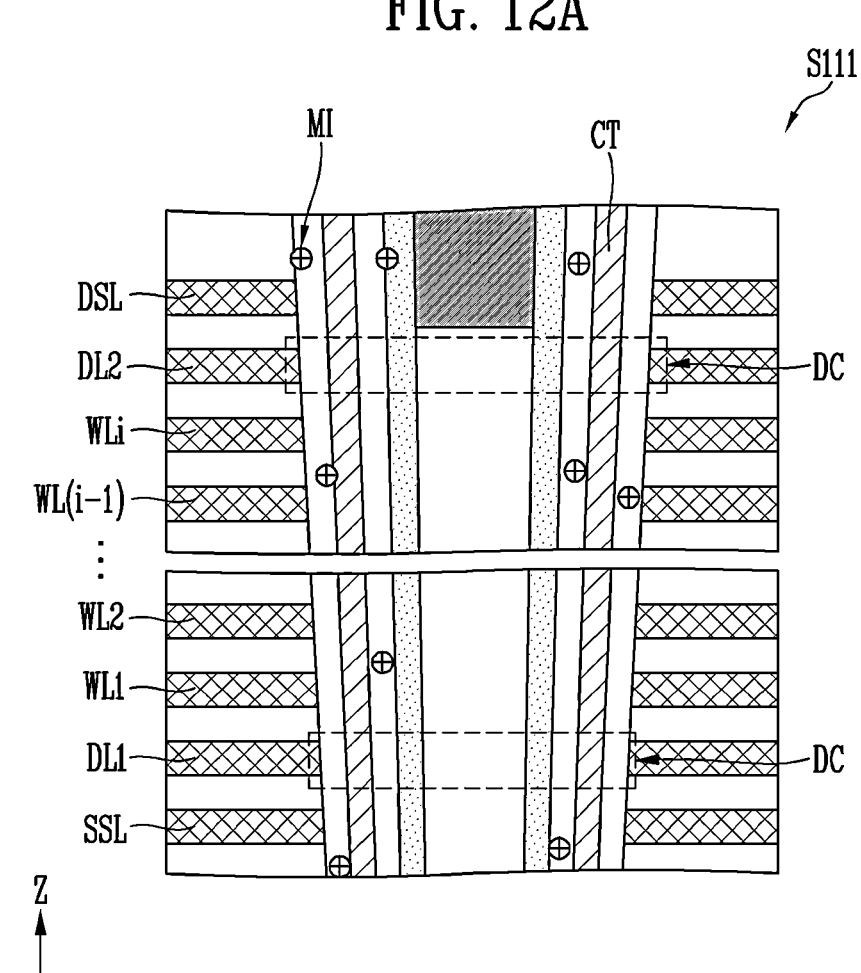

Referring to FIGS. 11 and 12A, a step of manufacturing a memory chip on a wafer may be performed (S111). In the step of manufacturing the memory chip, deposition processes using various materials and etching processes may be performed to form memory blocks and peripheral circuits, and mobile ions MI having a positive charge may be contained inside the memory chip during various processes are performed. In an embodiment, when the mobile ions MI are distributed throughout a wide area inside the memory chip, a retention characteristic of the memory chip may be deteriorated.

When the memory chip is completely manufactured, a first test operation for detecting a defect of the memory chip may be performed (S112). In the first test operation, a physical defect of the memory chip may be mainly detected. The deterioration of the retention characteristic is a defect gradually generated while the memory chip is used, and therefore, it is difficult to detect the deterioration of the retention characteristic in the first test operation. A memory chip of which defect is detected in the first test operation may be discarded.

Figure 12B:
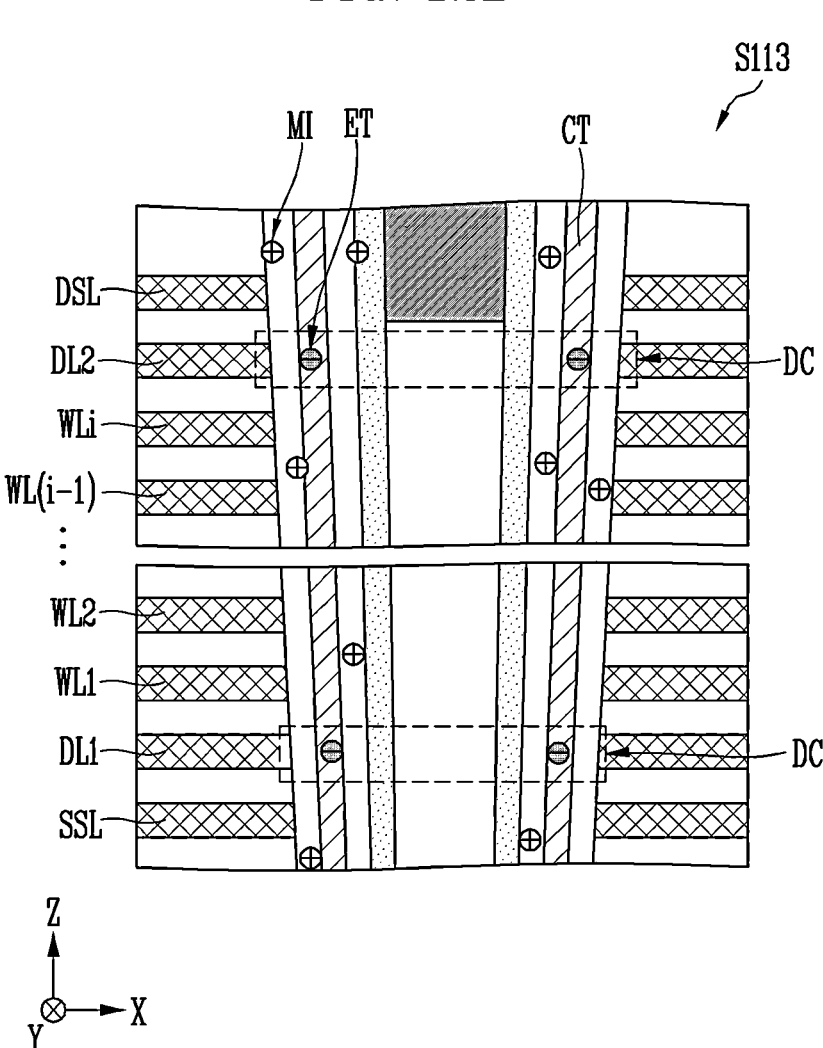

Referring to FIGS. 11 and 12B, in order to prevent or mitigate the deterioration of the retention characteristic of the memory chip, in an embodiment, a program operation for increasing a threshold voltage of dummy cells may be performed (S113). The program operation may be selectively performed on the dummy cells of the memory chip. Due to the program operation, electrons ET are trapped in the dummy cells, and the other memory cells are maintained in the erase state. Therefore, the dummy cells DC may have a negative charge. In an embodiment, the program operation may include programming at least one dummy cell whereby electrons ET are trapped in the at least one dummy cell.

Figure 12C:
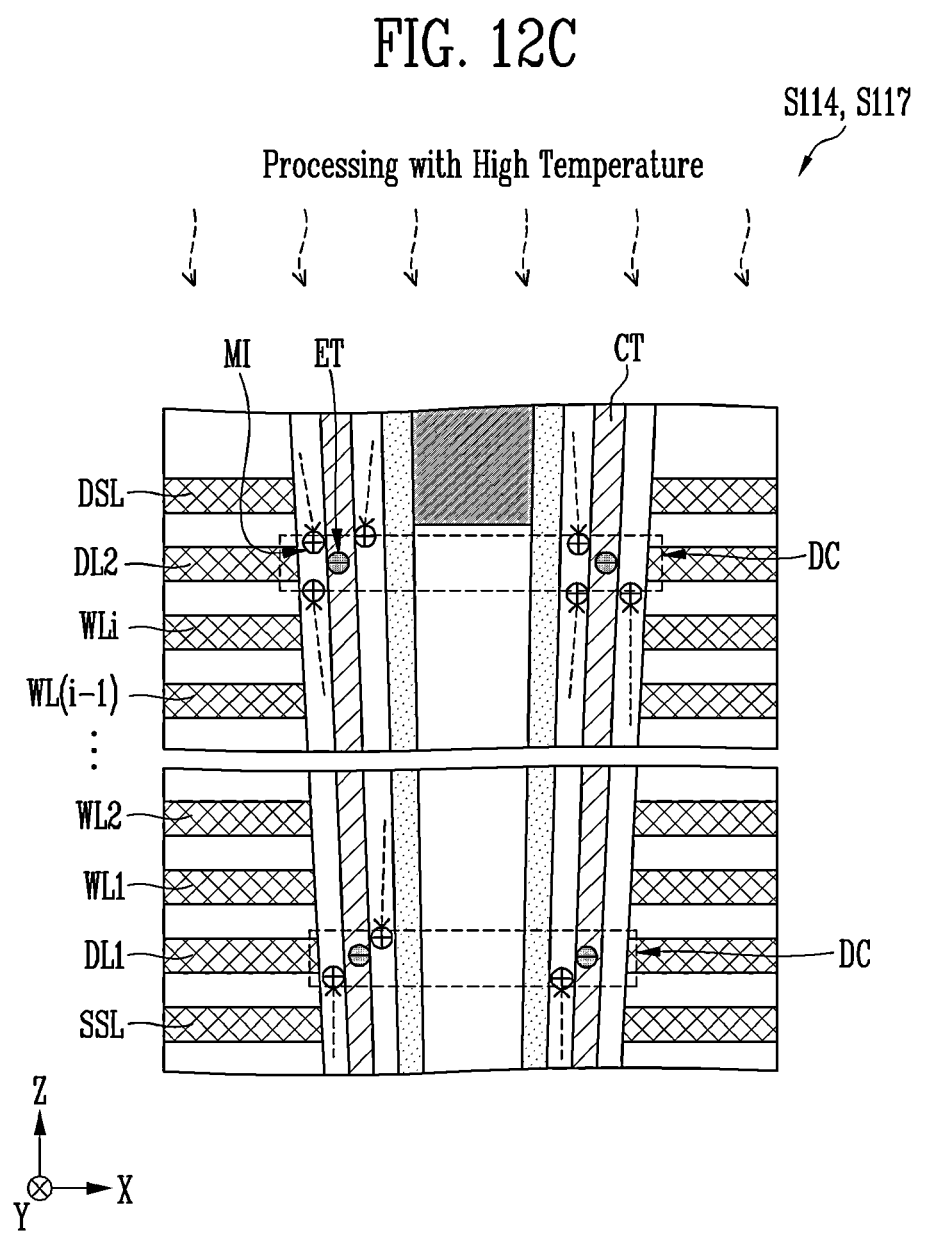

Referring to FIGS. 11 and 12C, a packaging process for packaging the memory chip in a semiconductor device may be performed (S114). In the packaging process, a plurality of memory chips may be attached on a package substrate, and wires may be connected between the plurality of memory chips and the package substrate. Subsequently, a protection layer for fixing and protecting the memory chips and the wires may be formed. The protection layer may be formed of an encapsulant. For example, the protection layer may be formed of epoxy resin as thermosetting resin. In the process of forming the protection layer, a high temperature process for curing the liquid encapsulant may be performed. For example, the high temperature process may be performed at a temperature of 50° C. or higher. When the protection layer is cured through the high temperature process, the memory chips, the wires, and the package substrate are integrated, so that the semiconductor device can be manufactured. In the high temperature process performed in the packaging process, the mobile ions MI distributed in the memory chips may be moved due to high temperature. The mobile ions may gather at the periphery of the dummy cells having the negative charge. In an embodiment, a packaging process may include stacking at least one memory chip on a package substrate, and at least one wire may be connected between the at least one memory chip and the package substrate. In some embodiments, the packaging process may further include forming a protection layer for fixing and/or protecting the at least one memory chip and the at least one wire.

When the semiconductor device is manufactured (S114), a second test operation for detecting a defect generated in the packaging process may be performed (S115). A semiconductor device of which defect is detected in the second test operation may be discarded.

In an embodiment, when the semiconductor device is manufactured, an additional program operation of dummy cells included in the semiconductor device may be performed to prevent or mitigate the deterioration of a retention characteristic of the semiconductor device (S116). Because the additional program operation performed in the step S116 is performed on the semiconductor device, the additional program operation may be simultaneously performed on the memory chips included in the semiconductor device. The additional program operation may be performed in the same manner as the program operation described in the step S113. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

When the program operation of the semiconductor device is ended, a bonding process for fastening the semiconductor device to a product may be performed (S117). As described with reference to FIG. 5, a high temperature process for reflowing the bumps BP formed at the bottom of the semiconductor device SCD may be performed in the bonding process. Because the additional program operation of the dummy cells is performed in the step S116, the other mobile ions which are not moved to the periphery of the dummy cells may be moved to the periphery of the dummy cells in the step S117.

Figure 12D:
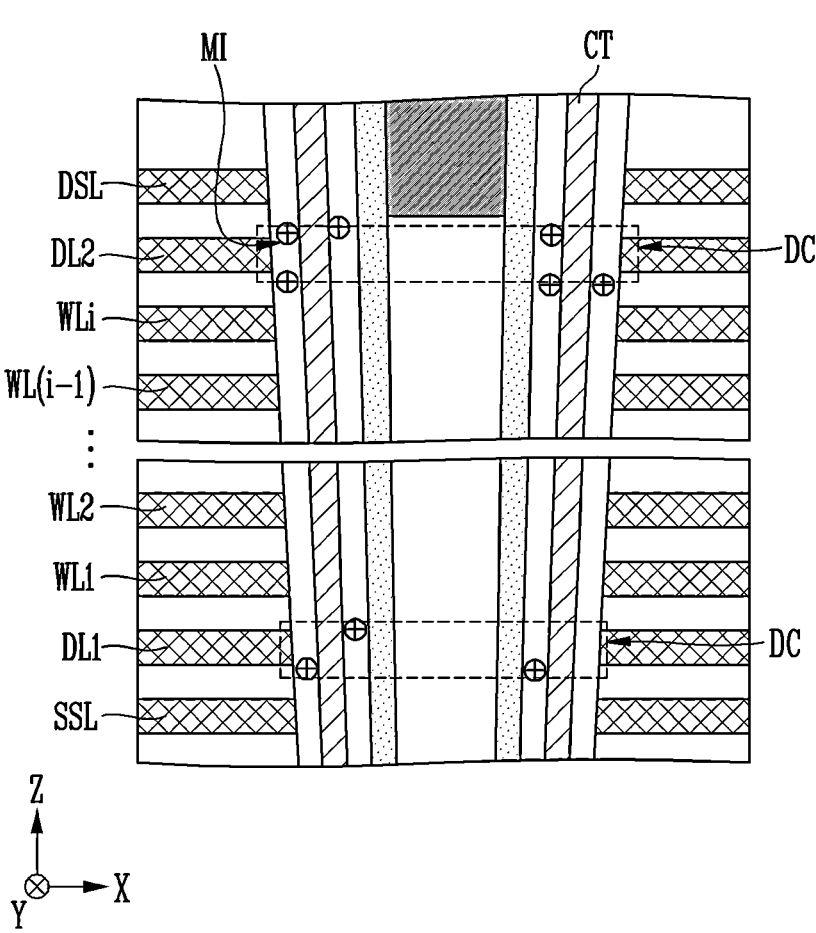

Referring to FIG. 12D, in an embodiment, when a program operation is performed by a user after the semiconductor device is fastened to the product, an erase operation is preferentially performed. Therefore, electrons ET trapped in the dummy cells are released. In an embodiment, after the product having the semiconductor device fastened thereto is released, the temperature does not become high in a high temperature environment of the step S114 or S117, and therefore, the mobile ions trapped at the periphery of the dummy cells may be fixed to the periphery of the dummy cells. Thus, in an embodiment, any mobile ions do not exist at the periphery of the memory cells, or a very small number of mobile ions exist even if any mobile ions exist. Accordingly, in an embodiment, the retention characteristic of the memory cells can be improved.

In accordance with various embodiments, movement of mobile ions of a memory chip is limited in a high temperature process performed after the memory chip is completely manufactured, so that the reliability of the semiconductor device can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor device, the method comprising:

manufacturing a memory chip including memory cells and a dummy cell; and programming the dummy cell before a packaging process of the memory chip is performed.

2. The method of claim 1, wherein the manufacturing of the memory chip includes:

stacking a source line and gate lines on a substrate;

forming a cell plug penetrating the gate lines, the cell plug including a first select transistor, the dummy cell, the memory cells, and a second select transistor; and forming a bit line contact and a bit line over the cell plug.

3. The method of claim 2, wherein the dummy cell is formed between the first select transistor and the memory cells.

4. The method of claim 2, wherein the dummy cell is formed between the second select transistor and the memory cells.

5. The method of claim 2, wherein the dummy cell is formed between the memory cells.

6. The method of claim 2, wherein the gate lines include:

a first select line connected to the first select transistor;

a dummy line connected to the dummy cell;

word lines connected to the memory cells; and a second select line connected to the second select transistor.

7. The method of claim 2, wherein, in the forming of the cell plug, additional dummy cells are further formed in the cell plug.

8. The method of claim 1, wherein the programming of the dummy cell is performed after the memory chip is completely manufactured.

9. The method of claim 1, wherein, in the programming of the dummy cell, the dummy cell is programmed to a highest threshold voltage among threshold voltages of programmed memory cells have for any one state of program states.

10. The method of claim 1, wherein the programming of the dummy cell is performed in a manner that applies a highest program voltage to a dummy line connected to the dummy cell.

11. The method of claim 10, wherein, after the program voltage is applied to the dummy line, a verify operation for determining a threshold voltage of the dummy cell is omitted.

12. The method of claim 1, wherein the manufacturing of the memory chip includes:

attaching the memory chip onto a package substrate;

connecting the memory chip to the package substrate through a wire;

forming a protection layer on the entire structure including the memory chip and the wire; and forming bumps on the bottom of the package substrate.

13. The method of claim 12, wherein the protection layer is formed of a liquid encapsulant.

14. The method of claim 13, wherein the liquid encapsulant is formed of epoxy resin as thermosetting resin.

15. The method of claim 13, wherein the liquid encapsulant is cured through a high temperature process performed in the packaging process.

16. The method of claim 1, further comprising:

after the semiconductor device is manufactured, performing an additional program operation of programming the dummy cell of the memory chip included in the semiconductor device; and fastening the semiconductor device to a product for memory systems.

17. The method of claim 16, wherein the additional program operation is performed in the same manner as the programming of the dummy cell.

18. The method of claim 16, wherein the fastening of the semiconductor device to the product for memory systems includes:

performing a high temperature process for reflowing bumps formed at a lower portion of the semiconductor device; and bonding the reflowed bumps to a bonding pad of the product.

19. A method of manufacturing a semiconductor device, the method comprising:

manufacturing a memory chip including memory cells and a dummy cell;

trapping electrons in the dummy cell by performing a program operation; and moving mobile ions distributed in the memory chip to a region adjacent to the dummy cell by performing a high temperature process, when the electrons are trapped in the dummy cell.

20. The method of claim 19, wherein the program operation is performed in an Incremental Step Pulse Program (ISPP) manner.

21. The method of claim 20, wherein a verify operation performed in the program operation is performed by setting, as a target level, a level corresponding to a highest program state among program states which the memory cells have.

22. The method of claim 19, wherein the program operation is performed in a manner that applies a program voltage to a dummy line connected to the dummy cell at least once.

23. The method of claim 22, wherein the program voltage is set as a voltage having a highest level among program voltages set in the program operation.

24. The method of claim 22, wherein, in the program operation, a verify operation for determining a threshold voltage of the dummy cell is omitted.

25. The method of claim 19, wherein the high temperature process is performed while a packaging process of the memory chip is performed.

26. The method of claim 19, wherein the high temperature process is performed at a temperature which is higher than a room temperature and at which the mobile ions are to be moved.

\* \* \* \* \*